(12) United States Patent
Matsushita et al.

(10) Patent No.: US 11,067,633 B2
(45) Date of Patent: Jul. 20, 2021

(54) REMAINING BATTERY AMOUNT ESTIMATION DEVICE, REMAINING BATTERY AMOUNT ESTIMATION METHOD, AND MEDIUM

(71) Applicant: ALPS ALPINE CO., LTD., Tokyo (JP)

(72) Inventors: Shuhei Matsushita, Miyagi (JP); Touichi Okuno, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 369 days.

(21) Appl. No.: 16/184,136

(22) Filed: Nov. 8, 2018

(65) Prior Publication Data

US 2019/0072616 A1 Mar. 7, 2019

Related U.S. Application Data

(63) Continuation of application No. PCT/JP2017/008987, filed on Mar. 7, 2017.

(30) Foreign Application Priority Data

Sep. 12, 2016 (JP) .............................. JP2016-177614

(51) Int. Cl.
*G01R 31/367* (2019.01)
*H01M 10/48* (2006.01)
(Continued)

(52) U.S. Cl.
CPC ......... *G01R 31/367* (2019.01); *G01R 31/371* (2019.01); *G01R 31/374* (2019.01);
(Continued)

(58) Field of Classification Search
CPC .............................. H02J 7/008; H02J 7/00718
See application file for complete search history.

(56) References Cited

U.S. PATENT DOCUMENTS 7,382,110 B2 6/2008 Hogari et al.
2009/0066529 A1 3/2009 Fukada
(Continued)

FOREIGN PATENT DOCUMENTS

JP 2005-315730 11/2005
JP 2009-063502 3/2009
(Continued)

OTHER PUBLICATIONS

International Search Report dated May 23, 2017 in PCT/JP2017/008987 filed on Mar. 7, 2017.

*Primary Examiner* — Lam S Nguyen
(74) *Attorney, Agent, or Firm* — IPUSA, PLLC

(57) ABSTRACT

A remaining battery amount estimation device 2 includes a discharged electric charge amount calculating unit 202 configured to calculate a discharged electric charge amount of a battery 11 that supplies power to an electronic device 1 per predetermined time TR based on operating state information related to an operating state for each predetermined time of the electronic device 1, and a remaining amount estimation unit 206 configured to calculate a total amount of discharged electric charge from the battery 11 based on the discharged electric charge amount per predetermined time, and estimate a remaining amount of the battery 11 based on the total amount of discharged electric charge.

17 Claims, 15 Drawing Sheets

(51) Int. Cl.
*H02J 7/00* (2006.01)
*G01R 31/3835* (2019.01)
*G01R 31/374* (2019.01)
*G01R 31/371* (2019.01)

(52) U.S. Cl.
CPC ...... *G01R 31/3835* (2019.01); *H01M 10/486* (2013.01); *H02J 7/0047* (2013.01); *H02J 7/0048* (2020.01)

(56) References Cited

U.S. PATENT DOCUMENTS

2012/0065824 A1 3/2012 Takahashi et al.
2014/0278166 A1 9/2014 Takahashi

FOREIGN PATENT DOCUMENTS

| JP | 2009215826 | * | 9/2009 |
|----|------------|---|--------|
| JP | 2010-283922 | | 12/2010 |
| JP | 2012-070474 | | 4/2012 |
| JP | 2014-183370 | | 9/2014 |

* cited by examiner

FIG.4A

OPERATING STATE INFORMATION

| TYPE OF OPERATION | NUMBER OF EXECUTIONS |
|---|---|
| WIRELESS COMMUNICATION X(1) | K(1) |
| SENSOR MEASUREMENT X(2) | K(2) |
| ⋮ | ⋮ |

FIG.4B

FIRST ELECTRIC CHARGE AMOUNT INFORMATION

| TYPE OF OPERATION | FIRST ELECTRIC CHARGE AMOUNT |
|---|---|
| WIRELESS COMMUNICATION X(1) | QX(1) |
| SENSOR MEASUREMENT X(2) | QX(2) |
| ⋮ | ⋮ |

FIG.4C

TIME INFORMATION

| TYPE OF OPERATION | EXECUTION TIME |
|---|---|
| WIRELESS COMMUNICATION X(1) | TX(1) |
| SENSOR MEASUREMENT X(2) | TX(2) |
| ⋮ | ⋮ |

FIG.6

| REMAINING AMOUNT | CORRECTION FACTOR |
|---|---|
| 90% | $\alpha(90\%)$ |
| 80% | $\alpha(80\%)$ |
| ⋮ | ⋮ |

FIG.8

| TEM-PERATURE \ REMAINING AMOUNT | 60 % | 55 % | ... | 15 % | 10 % |
|---|---|---|---|---|---|
| 40 °C | 3.05 V | 3.02 V | ... | 2.80 V | 2.65 V |
| 35 °C | 3.00 V | 2.95 V | ... | 2.75 V | 2.60 V |
| 30 °C | 2.95 V | 2.90 V | ... | 2.70 V | 2.55 V |
| 25 °C | 2.90 V | 2.86 V | ... | 2.68 V | 2.53 V |
| ... | ... | ... | ... | ... | ... |
| 0 °C | 2.81 V | 2.80 V | ... | 2.55 V | 2.40 V |

FIG.15A

FIRST ELECTRIC CHARGE AMOUNT INFORMATION

| TYPE OF OPERATION | FIRST ELECTRIC CHARGE AMOUNT | | | |
|---|---|---|---|---|
| | 0°C | 10°C | ... | 20°C |
| WIRELESS COMMUNICATION X(1) | QX(1) | QX(1) | ... | QX(1) |
| SENSOR MEASUREMENT X(2) | QX(2) | QX(2) | ... | QX(2) |
| ⋮ | ⋮ | ⋮ | ⋮ | ⋮ |

FIG.15B

SECOND ELECTRIC CHARGE AMOUNT INFORMATION

| SECOND ELECTRIC CHARGE AMOUNT | | | |
|---|---|---|---|
| 0°C | 10°C | ... | 20°C |
| QS | QS | ... | QS |

REMAINING BATTERY AMOUNT ESTIMATION DEVICE, REMAINING BATTERY AMOUNT ESTIMATION METHOD, AND MEDIUM

CROSS-REFERENCE TO RELATED APPLICATIONS

The present application is a continuation application of International Application No. PCT/JP2017/008987 filed on Mar. 7, 2017, which claims priority to Japanese Patent Application No. 2016-177614 filed on Sep. 12, 2016. The contents of these applications are incorporated herein by reference in their entirety.

BACKGROUND OF THE INVENTION

1. Field of the Invention

The present invention relates to a remaining battery amount estimation device for estimating the remaining amount of a battery used as a battery supply of an electronic device, a method and a medium thereof.

2. Description of the Related Art

Conventionally, as a method of estimating remaining battery amount, a method of estimating remaining amount based on a total discharged electric charge amount obtained by calculating an integral of discharged electric current of the battery, and a method of estimating remaining amount based on the terminal voltage of the battery and measured data are known. Patent Document 1 describes a method of calculating a remaining capacity rate of a secondary battery by combining the above-described methods.

CITATION LIST

Patent Document

[Patent Document 1] Japanese Unexamined Patent Application Publication No. 2005-315730

SUMMARY OF THE INVENTION

Technical Problem

Today, IOT (Internet of Things) is greatly drawing attention, and electronic devices that realize IOT are required to have smaller size and less power consumption. However, in a conventional remaining battery amount estimation method of integrating discharged current of the battery, it is necessary to have a dedicated circuit for measuring the current that flows from the battery. The circuit for measuring current includes, for example, a shunt resistor that converts a current to a voltage, an amplifier for amplifying a voltage generated at the shunt resistor, an AD converter for converting an output signal of the amplifier to a digital value, etc. When this type of circuit for measuring current is provided, the electronic device has a disadvantage of larger size. Further, the electronic device also has a disadvantage of shorter operating time due to the greater power consumption because the circuit for measuring current is caused to operate all the time.

The present invention has been made in view of the above problem. An object of the present invention is to provide a remaining battery amount estimation device, which is capable of estimating the remaining battery amount without having a circuit for measuring current, a method and a program thereof.

Solution to Problem

A first aspect of the present invention relates to a remaining battery amount estimation device for estimating the remaining battery amount that is used for supplying power to an electronic device. The remaining battery amount estimation device includes a discharged electric charge amount calculating unit configured to calculate a discharged electric charge amount of the battery per predetermined time based on operating state information related to an operating state for each predetermined time of the electronic device, and a remaining amount estimation unit configured to calculate a total amount of discharged electric charge from the battery based on the discharged electric charge amount per predetermined time, and estimate a remaining battery amount based on the total amount of discharged electric charge.

According to the above structure, a circuit for current measurement is not necessary because: the discharged electric charge amount per predetermined time is calculated based on the operating state information; the total amount of the discharged electric charge is calculated based on the discharged electric charge amount per predetermined time; and the remaining battery amount is estimated based on the total amount of discharged electric charge.

Preferably, the operating state information may include information related to the number of times the operation of the electronic device has been executed in predetermined time (period) with respect to each of operation types. The discharged electric charge amount calculating unit may calculate a first discharged electric charge amount in an operation period of the electronic device within the predetermined time based on: first electric charge information including information related to a first electric charge amount that is discharged from the battery with an execution of the operation with respect to each of the operation types; and the operating state information.

According to the above structure, it is possible to obtain discharged electric charge amount in the predetermined time for each operation type based on: the first electric charge amount that is discharged from the battery with an execution of the operation; and the number of times the operation has been executed within the predetermined time. The first discharged electric charge amount of the electronic device in an operation period within the predetermined time is calculated from the discharged electric charge amount obtained for each of the operation types.

Preferably, the above-described remaining battery amount estimation device may include an information obtaining unit for obtaining temperature information related to the temperature of the battery. The first electric charge amount information may include information related to temperature characteristics of the first electric charge amount. The discharged electric charge amount calculating unit may change the first electric charge amount used for calculating the first discharged electric charge amount based on: the information related to temperature characteristics of the first electric charge amount; and the temperature of the battery indicated by the temperature information.

According to the above structure, the first electric charge amount used for calculating the first discharged electric charge amount is changed based on: the temperature characteristics of the first electric charge amount; and the temperature of the battery indicated by the temperature information. According to the above, the first discharged electric charge amount is calculated using appropriate first electric charge amount corresponding to the temperature of the battery, and thus, accuracy of the first discharged electric charge amount is increased.

Preferably, the discharged electric charge amount calculating unit may calculate the second discharged electric charge amount in a waiting period of the electronic device within the predetermined time based on: time information including information related to execution time per execution of the operation for each of the operation types; the operating state information; and the second electric charge amount information related to the second electric charge amount that is discharged from the battery per unit time when the electronic device is in a waiting state.

According to the above structure, it is possible to calculate an operation period within the predetermined time for each of the operation types based on: the execution time per an execution of the operation; and the number of times the operation has been executed within the predetermined time. It is possible to calculate the waiting period of the electronic device within the predetermined time from the operation period for each of the operation types within the predetermined time. The second discharged electric charge amount in the waiting period is calculated based on: the second electric charge amount that is discharged from the battery per unit time when the electronic device is in a waiting state; and the waiting period.

Preferably, the above-described remaining battery amount estimation device may include an information obtaining unit for obtaining temperature information related to the temperature of the battery. The second electric charge amount information may include information related to temperature characteristics of the second electric charge amount. The discharged electric charge amount calculating unit may change the second electric charge amount used for calculating the second discharged electric charge amount based on: the information related to temperature characteristics of the second electric charge amount; and the temperature of the battery indicated by the temperature information.

According to the above structure, the second electric charge amount used for calculating the second discharged electric charge amount is changed based on: the temperature characteristics of the second electric charge amount; and the temperature of the battery indicated by the temperature information. According to the above, the second discharged electric charge amount is calculated using appropriate second electric charge amount corresponding to the temperature of the battery, and thus, accuracy of the second discharged electric charge amount is increased.

Preferably, the above-described remaining battery amount estimation device may include: an information obtaining unit for obtaining voltage information related to the voltage of the battery and temperature information related to the temperature of the battery; a temperature average value calculating unit for calculating an average value of the temperature of the battery based on the temperature information; a voltage average value calculating unit for calculating an average value of the voltage of the battery based on the voltage information; a voltage reference value calculating unit for calculating a reference value of the battery voltage before the rapid decrease of the battery voltage based on the average value of the voltage; and a first determination unit for determining that, in the case where a voltage difference between the average value of the voltage and the reference value of the voltage is compared with a first threshold value and the voltage difference is less than the first threshold value, it is appropriate to use a first estimation method in which the remaining battery amount is estimated based on the total amount of the discharged electric charge, and that, in the case where the voltage difference exceeds the first threshold value, it is appropriate to use a second estimation method in which the remaining battery amount is estimated based on the average value of the voltage and the average value of the temperature. The remaining amount estimation unit may include a first estimation unit for estimating the remaining battery amount based on the first estimation method and a second estimation unit for estimating the remaining battery amount based on the second estimation method.

According to the above structure, the remaining battery amount is estimated based on: the first estimation method that is based on the total amount of the discharged electric charge; and the second estimation method that is based on the average value of the voltage and the average value of the temperature. It is determined that it is appropriate to use the first estimation method in the case where the voltage difference between the reference value of the voltage before the rapid decrease of the voltage of the battery and the average value of the voltage is less than the first threshold value, and it is determined that it is appropriate to use the second estimation method in the case where the voltage difference exceeds the first threshold value. According to the above, it is determined that it is appropriate to use the first estimation method in a state before the rapid decrease of the battery voltage, and it is determined that it is appropriate to use the second estimation method in a state in which the battery voltage has rapidly decreased. Therefore, it becomes possible to select appropriately, as the estimation result of the remaining battery amount, an estimation result based on the first estimation method or an estimation result based on the second estimation method. Further, even in the case where there is a battery characteristics variation due to individual difference, an appropriate reference value corresponding to the battery characteristics variation is obtained because the reference value of the voltage is calculated based on the average value of the voltage.

Preferably, the voltage average value calculating unit may calculate the average value based on the voltage information that is obtained after the total amount of the discharged electric charge calculated by the first estimation unit has exceeded a predetermined minimum value.

According to the above structure, in the case where the battery voltage rapidly decreases in a state in which the total amount of the electric charge discharged from the battery is very small, the rapid change of the voltage does not readily influence the calculation result of the voltage average value calculating unit, and thus, it is possible to obtain an average value of the voltage that is accurate and stable.

Preferably, the remaining battery amount estimation device may include a control unit for controlling the electronic device and a second determination unit for determining whether the voltage difference between the average value of the voltage and the reference value of the voltage has become greater than a second threshold value that is less than the first threshold value. In the case where it is determined by the second determination unit that the voltage difference is greater than the second threshold value: the control unit may control the electronic device to increase frequency of the measurement of the battery voltage; the information obtaining unit may increase frequency of obtaining, as the voltage information, the voltage measurement value measured by the electronic device; the voltage average value calculating unit may increase frequency of calculating the reference value of the voltage; and the first determination unit may increase frequency of determining the estimation method.

According to the above structure, in the case where the voltage difference between the average value of the voltage and the reference value of the voltage has become close to a state of exceeding the first threshold value, frequency of the first determination unit's determination of the estimation method is increased, and thus, accuracy of the determination is increased and it becomes possible to select appropriately an estimation result of the remaining battery amount.

Preferably, the temperature average value calculating unit may calculate an average value of the temperature in a predetermined averaging time. The voltage average value calculating unit may correct the average value of the voltage in the averaging time according to the average value of the temperature. For example, the voltage average value calculating unit may calculate a sum of: a correction value corresponding to the difference between the average value of the temperature and the reference temperature; and the average value of the voltage.

According to the above structure, the average value of the voltage in the averaging time is corrected according to the average value of the temperature in the averaging time, and thus, it is possible to obtain the average value of the voltage in which influence of the temperature of the battery is included.

Preferably, the voltage average value calculating unit may change a correction factor for the correction value corresponding to the difference between the average value of the temperature and the reference temperature based on the remaining battery amount estimated by the remaining amount estimation unit.

According to the above structure, it is possible to obtain an average value of the voltage in which influence of the remaining amount of the battery is included.

Preferably, the voltage reference value calculating unit may identify the averaging time corresponding to a point in time at which an estimated value is obtained by the first estimation unit, the estimated value being different from the latest estimated value of the remaining battery amount by a predetermined value, and may obtain, as the reference value of the voltage, the average value calculated by the voltage average value calculating unit with respect to the identified averaging time.

According to the above structure, by making reference to a state of the battery in which an estimated value, which is different from the latest estimated value of remaining battery amount by a predetermined value, is obtained by the first estimation unit, an average value of the voltage that is calculated in the state is obtained as a reference value of the voltage. According to the above, even in the case where there is a battery characteristics variation due to individual difference, an appropriate reference value corresponding to the variation can be obtained.

Preferably, the voltage reference value calculating unit may identify a plurality of averaging times corresponding to a plurality of points in time at which estimated values are obtained by the first estimation unit, the estimated values coinciding a plurality of predetermined remaining battery amounts, and may obtain, as the reference value of the voltage, an average value calculated by further averaging a plurality of average values calculated by the voltage average value calculation unit with respect to the identified averaging times.

According to the above structure, by making reference to a plurality of states of the battery in which estimated values, which coincide a plurality of predetermined remaining battery amounts, are obtained, an average value, are obtained, a value, which is obtained by further averaging average values of the voltage calculated in the plurality of states, is obtained as a reference value of the voltage. According to the above, even in the case where there is a battery characteristics variation due to individual difference, an appropriate reference value corresponding to the variation can be obtained.

Preferably, the remaining battery amount estimation device may include an operating time estimation unit for estimating time in which the electronic device is capable of operation based on: an estimated value of discharge current of the battery; and the remaining battery amount estimated by the remaining amount estimation unit.

According to the above structure, based on the estimated remaining battery amount and an estimated value of the discharge current, the time, in which the electronic device is capable of operation, is estimated according to relatively simple calculations.

Preferably, the remaining battery amount estimation device may include: an estimated discharged electric charge amount calculation unit for calculating an estimated discharged electric charge amount of the battery for each predetermined time based on estimated operating state information related to an estimated operating state of the electronic device for each predetermined time; and an operating time estimation unit for estimating time in which the electronic device is capable of operation based on the estimated discharged electric charge amount for each predetermined time and the remaining battery amount estimated by the remaining amount estimation unit.

According to the above structure, it is possible to accurately calculate the time in which the electronic device is capable of operation based on: the estimated discharged electric charge amount of the battery per predetermined time; and the estimated remaining battery amount.

A second aspect of the present invention relates to a remaining battery amount estimation method for estimating a remaining battery amount that is used for supplying power to an electronic device. The remaining battery amount estimation method includes: a step of calculating a discharged electric charge amount of the battery per predetermined time based on operating state information related to an operating state for each predetermined time of the electronic device; and a step of calculating a total amount of discharged electric charge from the battery based on the discharged electric charge amount per predetermined time, and estimating a remaining battery amount based on the total amount of discharged electric charge.

Preferably, the above-described remaining battery amount estimation method may include: a step of obtaining voltage information related to the voltage of the battery; a step of obtaining temperature information related to the temperature of the battery; a step of calculating an average value of the temperature of the battery based on the temperature information; a step of calculating an average value of the voltage of the battery based on the voltage information; a step of calculating a reference value of the battery voltage before the rapid decrease of the battery voltage based on the average value of the voltage; and a step of determining, in the case where a voltage difference between the average value of the voltage and the reference value of the voltage is compared with a first threshold value and the voltage difference is less than the first threshold value, that it is appropriate to use a first estimation method in which the remaining battery amount is estimated based on the total amount of the discharged electric charge, and determining, in the case where the voltage difference exceeds the first threshold value, that it is appropriate to use a second estimation method in which the remaining battery amount is estimated based on the average value of the voltage and the average value of the temperature. The step of estimating the remaining battery amount may include a step of estimating the remaining battery amount based on the first estimation method and a step of estimating the remaining battery amount based on the second estimation method.

A third aspect of the present invention is a program used for causing a computer to perform a remaining battery amount estimation method related to the above second aspect.

Advantageous Effects of Invention

According to the present invention, it is possible to estimate the remaining battery amount without providing a circuit for current measurement.

BRIEF DESCRIPTION OF THE DRAWINGS

FIG. 4A through FIG. 4C are drawings illustrating examples of operating state information, first electric charge amount information, and time information.

FIG. 4A is an example of the operating state information, FIG. 4B is an example of the first electric charge amount information, and FIG. 4C is an example of the time information.

FIG. 6 is a drawing illustrating an example in which correction factors, which are used for temperature-based correction for the average value of the voltage, are set in different values according to estimated values of the remaining battery amount.

FIG. 8 is a drawing illustrating an example of a data table used for estimating the remaining battery amount according to the second estimation method.

FIG. 15A and FIG. 15B are drawings illustrating modified examples of first electric charge amount information and second electric charge amount information.

FIG. 15A illustrates a modified example of the first electric charge amount information and FIG. 15B illustrates a modified example of the second electric charge amount information.

DETAILED DESCRIPTION OF THE PREFERRED EMBODIMENTS

Figure 1:
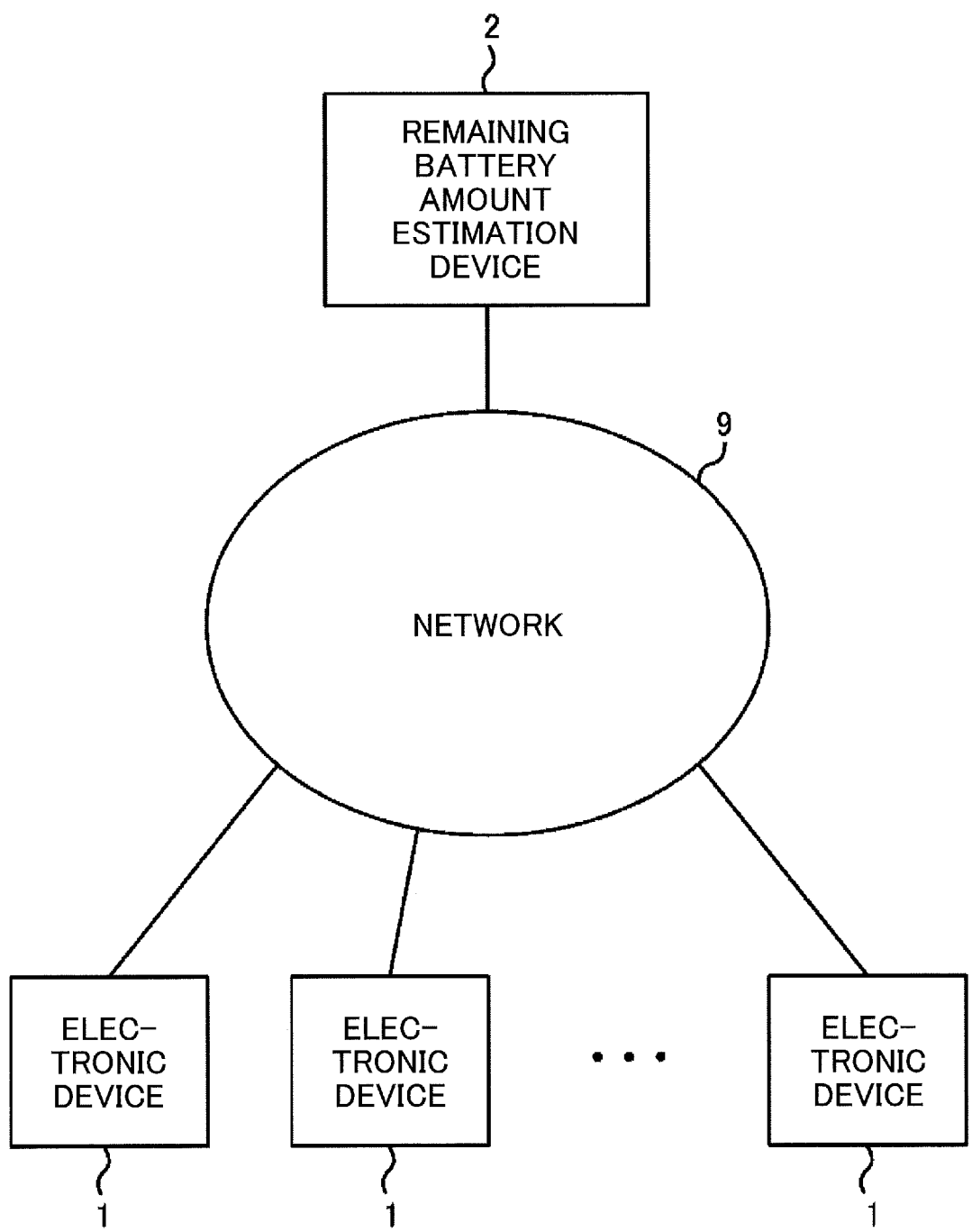
FIG. 1 is a drawing illustrating an example of a system configuration including a remaining battery amount estimation device according to an embodiment of the present invention.

FIG. 1 is a drawing illustrating an example of a system structure including a remaining battery amount estimation device 2 according to an embodiment of the present invention. In the system illustrated in FIG. 1, the remaining battery amount estimation device 2 communicates with a plurality of electronic devices 1 via a network 9 such as LAN, WAN, Internet, or the like. Each of the electronic devices 1 includes a predetermined sensor function, and transmits a result of the sensing to the remaining battery amount estimation device 2 or other server devices. It should be noted that the system illustrated in FIG. 1 is an example. At least a part of the calculation processes of the remaining battery amount estimation device 2, which will be described below, may be performed by the electronic devices 1 in other embodiments of the present invention.

Figure 2:
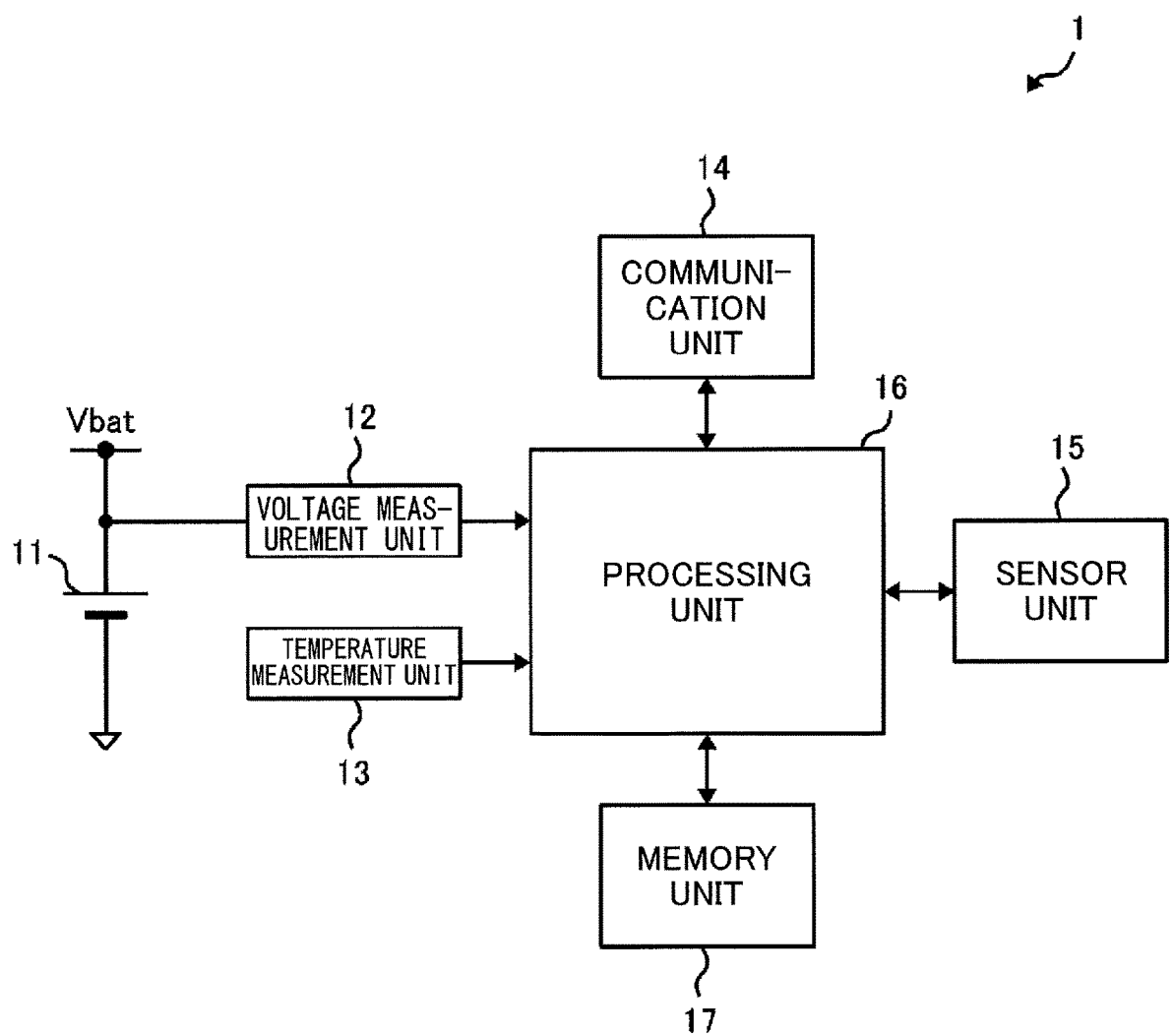
FIG. 2 is a drawing illustrating an example of a structure of an electronic device.

FIG. 2 is a drawing illustrating an example of a structure of the electronic device 1. The electronic device 1 illustrated in FIG. 2 includes a battery 11, a voltage measurement unit 12, a temperature measurement unit 13, a communication unit 14, a sensor unit 15, a processing unit 16, and a memory unit 17.

The battery 11 supplies, as power, a voltage Vbat to each of circuits of the electronic device 1. The battery 11 is a primary battery including a button battery, for example. It should be noted that, in other embodiments of the present invention, the battery 11 may be a secondary battery that can be charged. Further, the electronic device 1 may include a regulator circuit that lowers or boosts the voltage Vbat of the battery 11 and supplies the lowered or boosted voltage to each of the circuits.

The voltage measurement unit 12 is a circuit for measuring the voltage Vbat of the battery 11, and includes: an amplifying circuit for multiplying the voltage Vbat with a fixed gain and outputting the multiplied result; and an AD converter for converting an output of the amplifying circuit to a digital value.

The temperature measurement unit 13 is a circuit for measuring the temperature of the battery 11, and includes, for example, a semiconductor temperature sensor, a thermistor, etc.

The communication unit 14 is a circuit for communicating with the remaining battery amount estimation device 2 via a network 9, and includes, for example, an antenna and a transceiver used for performing wireless communications with an access point of a wireless LAN used for connecting to the network 9.

The sensor unit 15 includes various sensors including a geomagnetic sensor, and performs sensing according to control of the processing unit 16.

The processing unit 16 is a circuit for controlling overall operations of the electronic device 1, and includes, for example, a computer (microprocessor, or the like). The computer executes processes according to instruction codes of a program stored in the memory unit 17. It should be noted that the processing unit 16 may perform all processes by using the computer, or may perform at least some of the processes by using dedicated hardware.

The processing unit 16 controls the sensing operations of the sensor unit 15 according to commands received from an upper device via the communication unit 14, and transmits the sensing results to the upper device via the communication unit 14. Further, the processing unit 16 obtains periodically a voltage measurement value of the voltage measurement unit 12 and a temperature measurement value of the temperature measurement unit 13, and transmits, as the voltage information and the temperature information, the voltage measurement value and the temperature measurement value to the remaining battery amount estimation device 2. In this case, the processing unit 16 may transmit a plurality of the measurement values (voltage, temperature) during a predetermined period together to the remaining battery amount estimation device 2, or may transmit the measurement value to the remaining battery amount estimation device 2 every time the measurement is performed.

The memory unit 17 stores constant data and variable data used for the processes by the processing unit 16. The memory unit 17 includes, for example, a volatile memory such as a DRAM or an SRAM, a non-volatile memory such as a flash memory, a hard disk, etc.

Figure 3:
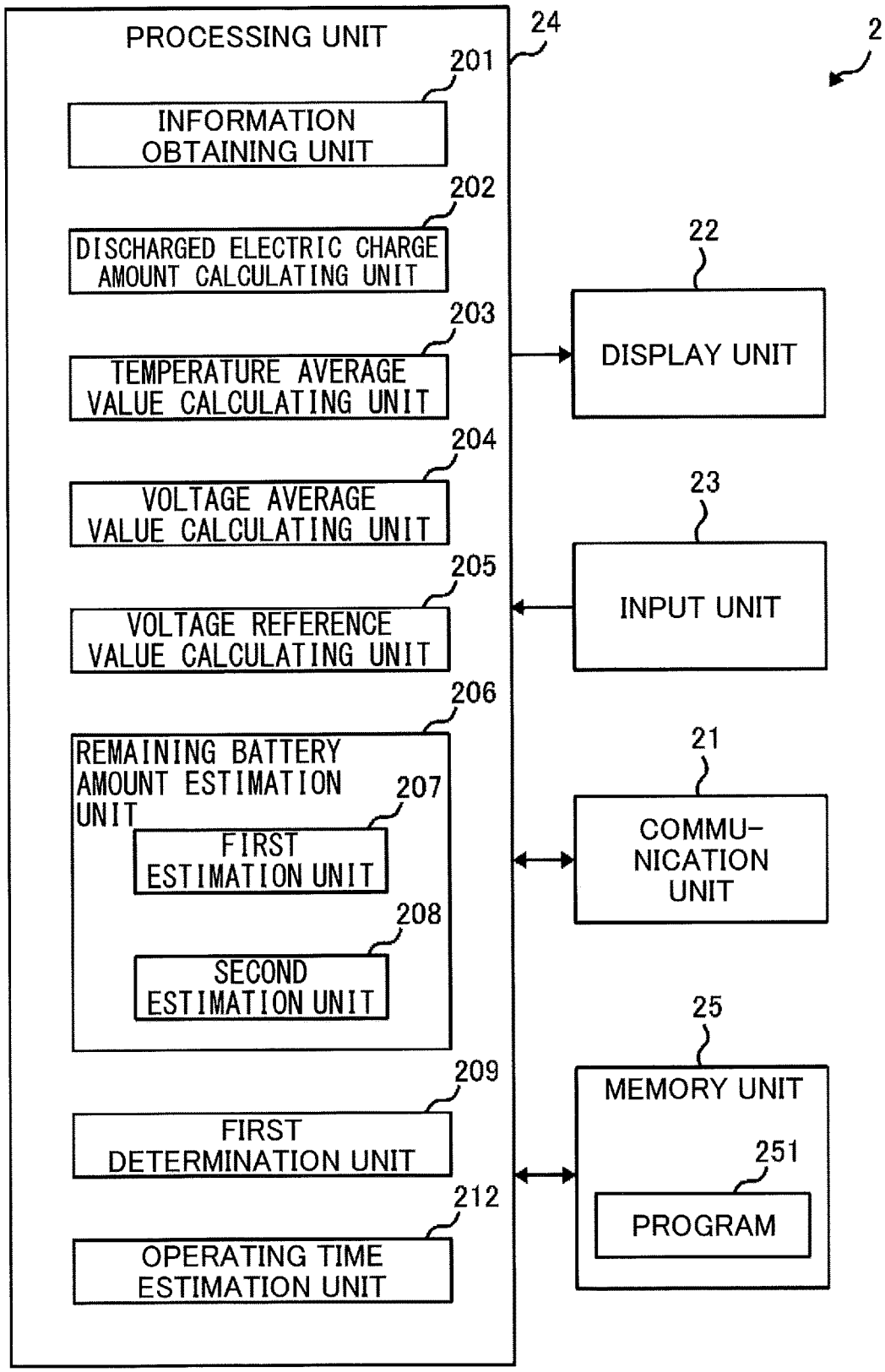
FIG. 3 is a drawing illustrating an example of a structure of a remaining battery amount estimation device according to an embodiment of the present invention.

FIG. 3 is a drawing illustrating an example of a structure of a remaining battery amount estimation device according to an embodiment of the present invention. The remaining battery amount estimation device 2 illustrated in FIG. 3 includes a communication unit 21, a display unit 22, an input unit 23, a processing unit 24, and a memory unit 25.

The communication unit 21 is a circuit for communicating with the electronic device 1 via the network 9, and includes, for example, a wired communication interface device or a wireless transceiver that is capable of connecting to the network 9.

The display unit 22 and the input unit 23 are user interface devices of the remaining battery amount estimation device 2. The display unit 22 is a device for displaying an image (still image or video image) corresponding to a video signal output from the processing unit 24, and includes a liquid crystal display or an organic EL display. The input unit 23 is a device used for inputting information corresponding to user's operations to the processing unit 24, and includes, for example, a keyboard, a mouse, a touch panel, etc.

The processing unit 24 is a circuit for controlling overall operations of the remaining battery amount estimation device 2, and includes, for example, a computer (microprocessor, or the like). The computer executes processes according to instruction codes of a program 251 stored in the memory unit 25. It should be noted that the processing unit 24 may perform all processes by using the computer, or may perform at least some of the processes by using dedicated hardware.

In an example of FIG. 3, the processing unit 24 includes an information obtaining unit 201, a discharged electric charge amount calculating unit 202, a temperature average value calculating unit 203, a voltage average value calculating unit 204, a voltage reference value calculating unit 205, a remaining battery amount estimation unit 206, a first determination unit 209, and an operating time estimation unit 212.

[Information Obtaining Unit 201]

The information obtaining unit 201 communicates with the electronic device 1 via the communication unit 21, and obtains voltage information related to the voltage of the battery 11 of the electronic device 1 and temperature information related to the temperature of the battery 11. The voltage information includes one or more voltage measurement values and the temperature information includes one or more temperature measurement values. The information obtaining unit 201 stores the obtained voltage information and the temperature information in the memory unit 25.

[The Discharged Electric Charge Amount Calculating Unit 202]

The discharged electric charge amount calculating unit 202 calculates a discharged electric charge amount D of the battery 11 per predetermined time TR based on operating state information related to an operating state of the electronic device 1 per predetermined time TR. For example, the discharged electric charge calculating unit 202 calculates the discharged electric charge amount D by adding: a first discharged electric charge amount DX during a period (operating period) in which the electronic device 1 performs a predetermined operation; and a second discharged electric charge amount DS during a period (waiting period) in which the electronic device 1 is in a waiting state.

The discharged electric charge calculating unit 202 calculates the first discharged electric charge amount DX during the operating period within the predetermined time TR based on operating state information and first electric charge amount information that are described below.

FIG. 4A illustrates an example of the operating state information. The operating state information includes information related to the number of times a predetermined operation X of the electronic device 1 has been executed within the predetermined time TR with respect to each of operation types. In an example of FIG. 4A, as the operation types, a wireless communication operation $X(1)$ in the communication unit 14 and a measurement operation $X(2)$ in the sensor unit 15 are included. Within the predetermined time TR, the number of execution times of the wireless communication operation $X(1)$ is "$K(1)$", and the number of execution times of the measurement operation $X(2)$ is "$K(2)$".

The operating state information may be obtained from, for example, a server (not shown) that controls operations of the electronic device 1, or from the electronic device 1 itself. Further, in the case where the operations of the electronic device 1 are controlled by the remaining battery amount estimation device 2, information, indicating the result of the control or indicating the control plan, stored in the memory unit 25 may be used as the operating state information.

FIG. 4B illustrates an example of the first electric charge amount information. The first electric charge amount information includes information related to a first electric charge amount QX that is discharged from the battery 11 at a time of the operation X with respect to each of the operation types. In an example of FIG. 4B, a discharged electric charge amount (first electric charge amount) at a time of wireless communication operation $X(1)$ is "$QX(1)$", and a discharged electric charge amount (first electric charge amount) at a time of measurement operation $X(2)$ is "$QX(2)$". The first electric charge amount information is obtained by measuring the discharged electric charge amount at a time of each operation, or by calculating it according to simulations. The obtained first electric charge amount information is stored in the memory unit 25 in advance.

It is assumed that there are N types of operations of the electronic device 1, and that "i" is an arbitrary integer 1 to N. When the number of execution times of the operation $X(i)$ within the predetermined time TR is referred to as "$K(i)$", and the discharged electric charge amount at a time of operation X(i) is referred to as "QX(i)", the first discharged electric charge amount DX in an operating period within the predetermined time TR can be determined by the following formula.

[Math 1]

$$DX = \sum_{i=1}^{N} QX(i) \times K(i) \quad (1)$$

The discharged electric charge calculating unit 202 calculates a second discharged electric charge amount DS during a waiting period within the predetermined time TR based on: the above-described operating state information; time information related to execution time at a time of each operation; and second electric charge amount information related to a discharged electric charge amount in a waiting state.

FIG. 4C illustrates an example of the time information. The time information includes information related to time of execution by the electronic device 1 at a time of operation with respect to each operation type. In an example of FIG. 4C, the execution time of the wireless communication operation X(1) at a time is "TX(1)", the execution time of the measurement operation X(2) at a time is "TX(2)". The time information is obtained by measuring the execution time at a time of each operation, or by calculating it according to simulations. The obtained time information is stored in the memory unit 25 in advance.

The second electric charge amount information is information related to a second electric charge amount QS that is discharged from the battery 11 during a unit of time when the electronic device 1 is in a waiting state. The second electric charge amount QS is obtained by measuring the discharged electric charge amount (discharged current) during a unit of time in a waiting state, or by calculating it according to simulations. The obtained second electric charge amount QS is stored in the memory unit 25 in advance.

Figure 5:
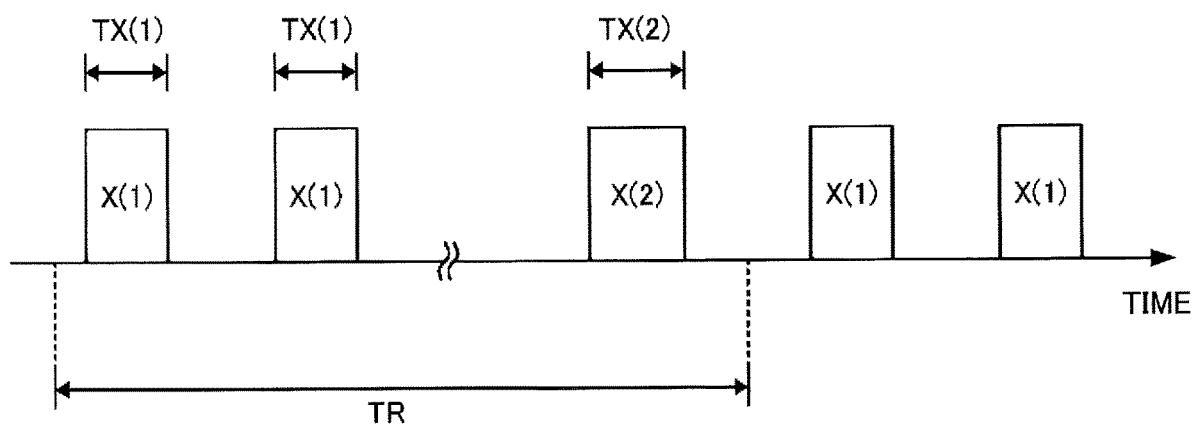
FIG. 5 is a drawing illustrating examples of operating states of the electronic device.

FIG. 5 is a drawing illustrating examples of operating states of the electronic device 1. As illustrated in FIG. 5, the waiting period TS within the predetermined TR corresponds to a period that is calculated by subtracting all of the execution periods of all operations within the predetermined time TR from the predetermined time TR. When execution time of the operation X(i) at a time is referred to as "TX(i)", the waiting period TS is calculated by the following formula.

[Math 2]

$$TS = TR - \sum_{i=1}^{N} TX(i) \times K(i) \quad (2)$$

The second discharged electric charge amount DS during the waiting period within the predetermined time TR is calculated using the second electric charge amount QS and the waiting period TS based on the following formula.

[Math 3]

$$DS = QS \times RS \quad (3)$$

The discharged electric charge amount D of the battery 11 within the predetermined time TR is a sum of the first discharged electric charge amount DX and the second discharged electric charge amount DS. Therefore, the discharged electric charge amount D is calculated using formula (1) through formula (3) based on the following formula.

[Math 4]

$$D = \sum_{i=1}^{N} QX(i) \times K(i) + QS * \left( TR - \sum_{i=1}^{N} TX(i) \times K(i) \right) \quad (4)$$

Therefore, the discharged electric charge calculating unit 202 calculates the discharged electric charge amount D per predetermined time TR based on: the operating state information; the first electric charge amount information; the time information; and the second electric charge amount information, according to the formula (4).

[Temperature Average Value Calculating Unit 203]

The temperature average value calculating unit 203 calculates an average value of the temperature of the battery 11 during a predetermined averaging period TA based on the temperature information (temperature measurement value of the battery 11) obtained from the electronic device 1. For example, the temperature average value calculating unit 203 reads, from the memory unit 25, temperature measurement values in chronological order from the current time to the averaging period TA ago, and calculates an average value thereof.

[Voltage Average Value Calculating Unit 204]

The voltage average value calculating unit 204 calculates an average value of the voltage of the battery 11 during a predetermined averaging period TA based on the voltage information (voltage measurement value of the battery 11) obtained from the electronic device 1. For example, the voltage average value calculating unit 204 reads, from the memory unit 25, voltage measurement values in chronological order from the current time to the averaging period TA ago, and calculates an average value thereof.

Further, the voltage average value calculating unit 204 corrects the average value of the voltage during the averaging period TA based on an average value of the temperature obtained by the temperature average value calculating unit 203. When an average value of the voltage during the averaging period TA is referred to as "Va", the average value of the temperature is referred to as "Ma", the corrected average value of the voltage is referred to as "Vb", the correction factor is referred to as "α", and the reference temperature is referred to as "Ms", the corrected average value Vb of the voltage is represented by the following formula.

[Math 5]

$$Vb = Va + \underbrace{\alpha \times (Ms - Ma)}_{Vc} \quad (5)$$

The second term of the right side of the formula (5) is a correction value Vc that varies according to the temperature. The correction value Vc corresponds to a difference between the average value Ma of the temperature and the reference temperature Ms. The voltage average value calculating unit 204 calculates the corrected average value Vb of the voltage by adding the correction value Vc to the average value Va of the voltage.

Further, based on the remaining amount of the battery 11 estimated by the remaining battery amount estimation unit 206 as described below, the voltage average value calculating unit 204 changes the correction factor α of the correction value Vc corresponding to the difference between the average value Ma of the temperature and the reference temperature Ms. FIG. 6 is a drawing illustrating an example in which the correction factor α is set as a different value according to the estimated value of the remaining battery amount. In FIG. 6, "α(90%)" indicates a correction factor in the case of the estimated value of the remaining amount being 90%, "α(80%)" indicates a correction factor in the case of the estimated value of the remaining amount being 80%. The estimated value of the remaining amount is, for example, an estimated value obtained by using an estimation method that is determined to be appropriate by the first determination unit 209 as described below.

Figure 7:
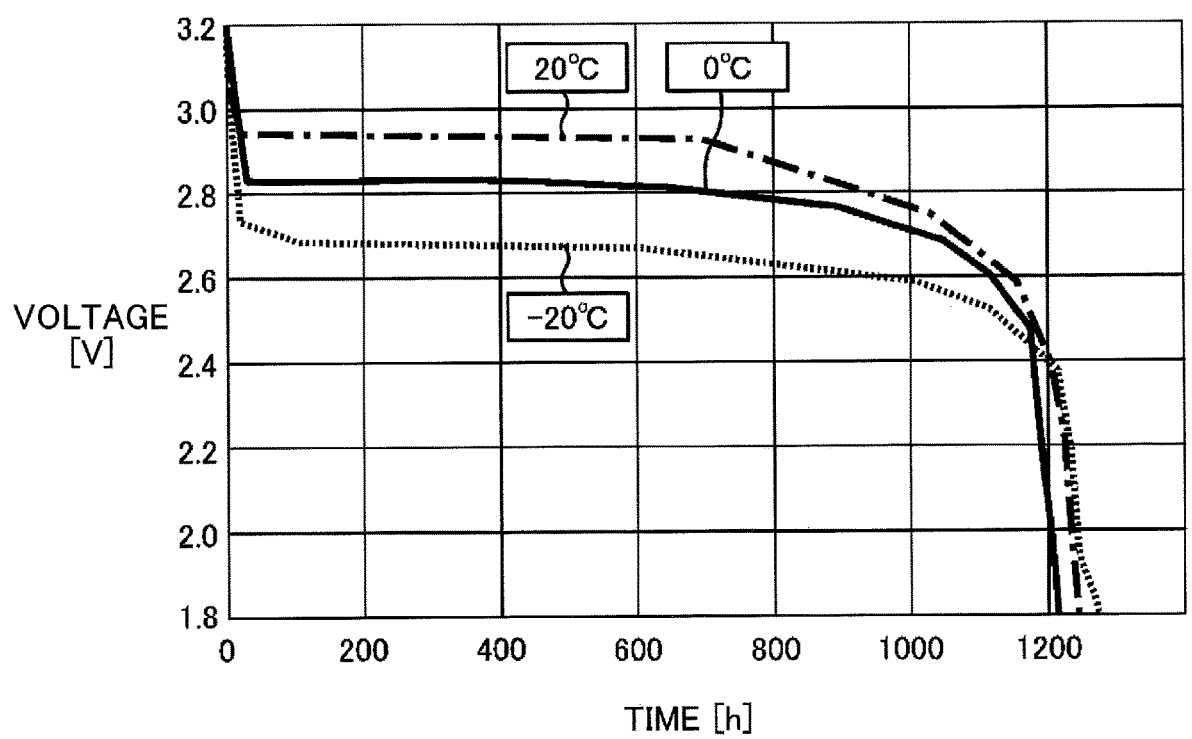
FIG. 7 is a drawing illustrating changes of voltage in a case where the battery is discharged at a constant current.

FIG. 7 is a drawing illustrating an example of the voltage change in the case where the battery 11 is discharged at a constant current. The vertical axis indicates voltage and the horizontal axis indicates time. As illustrated in FIG. 7, the voltage of the battery 11 varies according to the temperature. The correction value Vc of the second term of formula (5) is used for converting the average value Va of the voltage, which varies according to the temperature, to a voltage with respect to the reference temperature Ms, and is an approximate value obtained from a temperature difference (Ms−Ma) and a voltage difference (Vb−Va) by using the correction factor. The correction factor α is obtained based on the measurement result or based on the simulation, and is stored in the memory unit 25 in advance.

It should be noted that, as illustrated in FIG. 7, in an initial state in which the total amount of the electric charge discharged from the battery (total discharged electric charge amount) is very small, the voltage of the battery 11 tends to decrease rapidly. Therefore, the voltage average value calculating unit 204 calculates the average voltage value Vb based on the voltage information (voltage measurement value) that is obtained after the total amount of the discharged electric charge calculated by the first estimation unit 207 has exceeded a predetermined minimum value. According to the above, the rapid voltage change in an initial state, in which the total discharged electric charge amount is very small, does not tend to affect the calculation result of the average voltage value Vb, and thus, it is possible to obtain a stable and accurate average voltage value Vb.

[Voltage Reference Value Calculating Unit 205]

The voltage reference value calculating unit 205 calculates a reference value Vs of the voltage of the battery 11 before the rapid decrease of the voltage based on the average value Vb of the voltage calculated by the voltage average value calculating unit 204. Specifically, the voltage reference value calculating unit 205 identifies an averaging time TA corresponding to a point in time at which an estimated value U+ΔU, which is different from the latest estimated value U of the remaining battery amount by a predetermined value ΔU, is obtained by a first estimation unit 207 that will be described below, and obtains, as the reference value Vs of the voltage, an average value Vb calculated by the voltage average value calculating unit 204 with respect to the identified averaging time TA. For example, when it is assumed that the voltage average value calculating unit 204 and the first estimation unit 207 repeat processes at the same cycle, the voltage reference value calculating unit 205 obtains, as the reference voltage value Vs, an average value Vb that is calculated by the voltage average value calculating unit 204 at a processing cycle that is the same processing cycle or an adjacent processing cycle at which a result of estimation, which is closest to the estimation value U+ΔU, is obtained by the first estimation unit 207. The reference voltage value Vs is used for determination of the estimation method of remaining battery amount by the first determination unit 209, which will be described below.

[Remaining Battery Amount Estimation Unit 206]

The remaining battery amount estimation unit 206 estimates the remaining amount of the battery 11. Here, the above-described "remaining amount" is a numerical value indicating a relationship between the maximum electric charge amount that can be extracted from the battery 11 (nominal capacity or effective capacity) and the electric charge amount that has actually been discharged. For example, the "remaining amount" is a remaining electric charge amount obtained by subtracting the electric charge amount that has actually been discharged from the maximum electric charge amount (nominal capacity or effective capacity), or is a ratio obtained by dividing the remaining electric charge amount with the maximum electric charge amount (nominal capacity or effective capacity). Here, as an example, the "remaining amount" is used as a ratio. However, the numerical value that is calculated by the remaining battery amount estimation unit 306 is not limited to the ratio, but may be other numerical values indicating the relationship between the maximum electric charge amount that can be extracted from the battery 11 and the electric charge amount that has actually been discharged.

The remaining battery amount estimation unit 206 includes two estimation units (first estimation unit 207 and second estimation unit 208) that estimate the remaining amount of the battery 11 based on different estimation methods.

The first estimation unit 207 estimates the remaining amount of the battery 11 based on the first estimation method. In the first estimation method, a total amount of the electric charge discharged from the battery 11 is calculated based on the discharged electric charge amount D per predetermined time TR that is calculated by the discharged electric charge amount calculating unit 202, and an estimated value U of the remaining amount of the battery 11 is calculated based on the total amount of the discharged electric charge.

For example, in, the case where the discharged electric charge amount calculating unit 202 calculates the discharged electric charge amount D at a cycle that is the same as the predetermined time TR, the first estimation unit 207 calculates the total amount of the discharged electric charge by accumulating the discharged electric charge amount D.

Further, in the case where the discharged electric charge amount calculating unit 202 calculates the discharged electric charge amount D at a cycle TL that is greater than the predetermined time TR, it is assumed that, during the period TL, an estimated average current IF is "IF=D/TR", and the first estimation unit 207 calculates the discharged electric charge amount DO per period TL based on "DL=IF*TL". The first estimation unit 207 calculates the total amount of the discharged electric charge by accumulating the discharged electric charge amount DL.

In the case where it is assumed that the maximum electric charge amount (nominal capacity or effective capacity) that can be extracted from the battery 11 is "B", the total amount of the discharged electric charge is "S", and the estimated value of the remaining amount of the battery 11 is "U", the first estimation unit 207 calculates the estimated value U of the remaining amount of the battery 11 based on "U=(B−S)/B".

With respect to the above, the second estimation unit 208 estimates the remaining amount of the battery 11 based on the second estimation method. In the second estimation method, the remaining amount of the battery 11 is estimated based on: an average value Vb of the voltage calculated by the voltage average value calculating unit 204; and an average value Ma of the temperature calculated by the temperature average value calculating unit 203.

FIG. 8 is a drawing illustrating an example of a data table used for estimating the remaining battery amount according to the second estimation method. Numerical values in the table illustrated in FIG. 8 indicate voltages of the battery 11. Each row of the data table indicates the relationship between the voltage of the battery 11 and the remaining amount in the case of the same temperature. The numerical values in the data table are obtained based on the measurement result or based on the calculation using the simulation, and are stored in the memory unit 25 in advance. By referring to the data table illustrated in FIG. 8, the second estimation unit 208 obtains an estimated value U of the remaining amount corresponding to the average temperature value Ma and the average voltage value Vb.

[First Determination Unit 209]

The first determination unit 209 determines an appropriate method from the first estimation method and the second estimation method based on the voltage difference (Vs−Vb) between the average voltage value Vb calculated by the voltage average value calculating unit 204 and the reference value Vs of the voltage calculated by the voltage reference value calculating unit 205. In other words, the first determination unit 209 compares the voltage difference (Vs−Vb) with a first threshold value Th1, determines that the first estimation method is appropriate in the case where the voltage difference (Vs−Vb) is less than the first threshold value Th1, and determines that the second estimation is appropriate in the case where the voltage difference (Vs−Vb) is greater than the first threshold value Th1.

As illustrated in FIG. 7, the voltage of the battery 11 is kept at an approximately fixed voltage in the case where the remaining amount is relatively large. However, the voltage decreases rapidly when the remaining amount becomes less than a certain level. In a range in which the voltage of the battery 11 is kept at an approximately fixed voltage, there will be a large error if the second estimation method based on the voltage is used, and thus, it is appropriate to use the first estimation method based on the total amount of the discharged electric charge. In a range in which the voltage of the battery 11 decreases rapidly, the change is more significant in the voltage than in the total amount of the discharged electric charge, and the accumulated error included in the total amount of the discharged electric charge becomes large, and thus, it is appropriate to use the second estimation method.

The voltage difference (Vs−Vb) between the average voltage value Vb and the reference value Vs increases according to the rapid decrease of the voltage of the battery 11. Therefore, in the case where the voltage difference (Vs−Vb) is less than the first threshold value Th1, the voltage of the battery 11 is in a range in which the voltage is approximately a fixed voltage, and thus, it is appropriate to use the first estimation method. In the case where the voltage difference (Vs−Vb) is greater than the first threshold value Th1, it can be determined that the voltage of the battery 11 is in a range in which the voltage decreases rapidly, and thus, it is appropriate to use the second estimation method.

[Operating Time Estimation Unit 212]

The operating time estimation unit 212 estimates time during which the electronic device 1 is operable based on: an estimated value of the discharge current of the battery 11; and the remaining amount of the battery 11 estimated by the remaining battery amount estimation unit 206. The estimated value of the discharge current of the battery 11 is, for example, a value calculated from a latest discharged electric charge amount D per a predetermined time TR, which is calculated by the discharged electric charge amount calculating unit 202, according to "D/TR". The operating time estimation unit 212 calculates an estimated value of time during which the electronic device 1 is operable by dividing, by the estimated value of the discharge current, the electric charge amount (remaining electric charge amount that can be extracted from the battery 11) that corresponds to the remaining amount of the battery 11 estimated by the remaining battery amount estimation unit 206.

It should be noted that, in the case where the operation plan of the electronic device 1 is determined, the estimated value of the operating time may be calculated by using the estimated value of the discharge current of the battery 11 corresponding to the operation plan.

Here, referring to flowcharts illustrated in FIG. 9 to FIG. 11, operations of the remaining battery amount estimation device 2 according to an embodiment of the present invention with the above-described configuration will be described.

Figure 9:
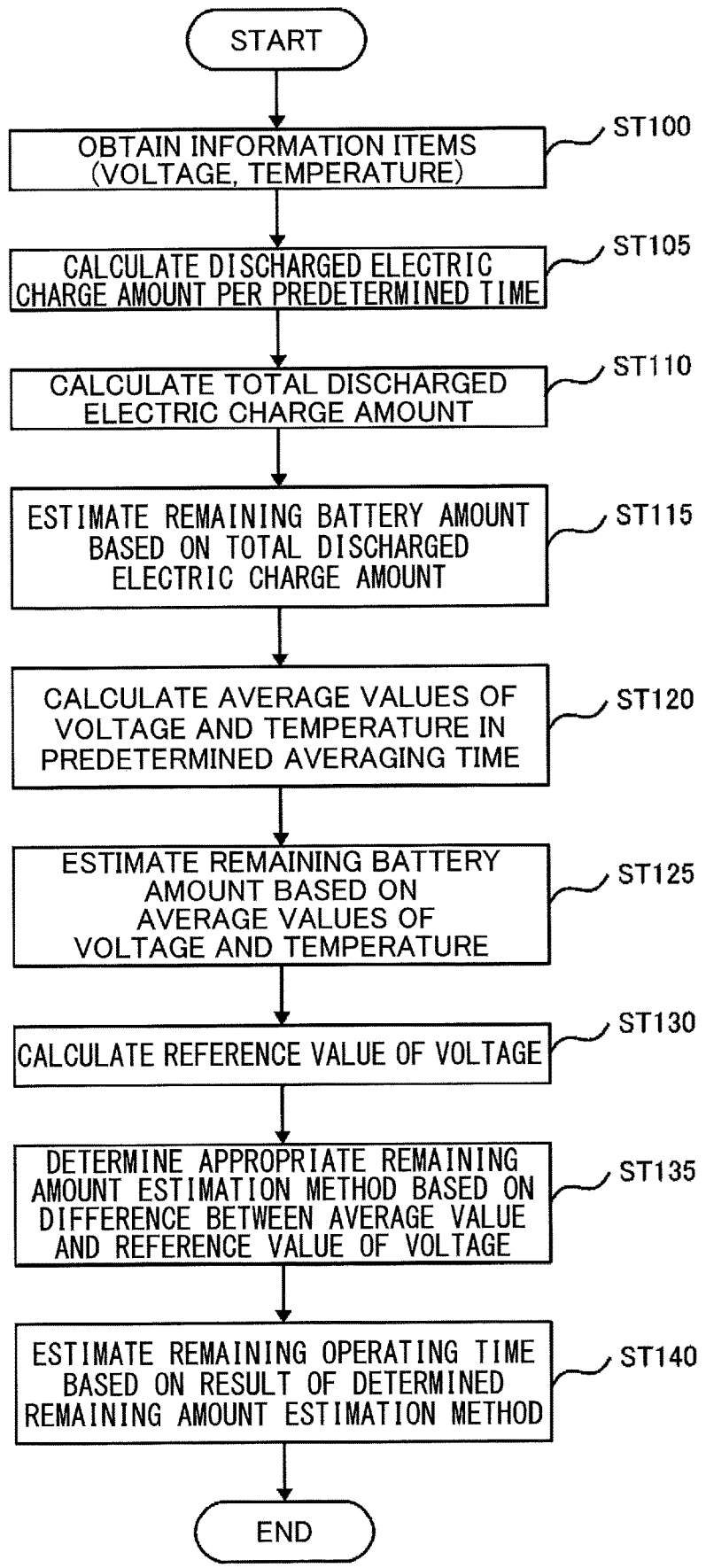
FIG. 9 is a flowchart illustrating: a process of estimating a remaining battery amount in a remaining battery amount estimation device according to an embodiment of the present invention; and a process of estimating an operating time of the electronic device.

FIG. 9 is a flowchart illustrating: a process of estimating a remaining battery amount in a remaining battery amount estimation device 2 according to an embodiment of the present invention; and a process of estimating operating time of the electronic device 1. The remaining battery amount estimation device 2 performs repeatedly the processes illustrated in FIG. 9 at a fixed cycle (e.g., at predetermined time TR).

ST100:

The information obtaining unit 201 obtains voltage information (voltage measurement value) and temperature information (temperature measurement value) from the electronic device 1.

ST105:

The discharged electric charge amount calculating unit 202 calculates the discharged electric charge amount D per predetermined time TR based on: operating state information per predetermined time TR (FIG. 4A); first electric charge amount information (FIG. 4B); time information (FIG. 4C); and second electric charge amount information, according to the formula (4).

ST110:

The first estimation unit 207 calculates a total amount S of the electric charge discharged from the battery 11 based on the discharged electric charge amount D per predetermined time TR that is calculated by the discharged electric charge amount calculating unit 202. For example, the first estimation unit 207 accumulates the discharged electric charge amounts D that are calculated for respective predetermined time periods TR by the discharged electric charge amount calculating unit 202.

ST115:

The first estimation unit 207 calculates the estimated value U of the remaining amount of the battery 11 according to "U=(B−S)/B" based on: the total amount S of the discharged electric charge calculated in step ST110; and the maximum electric charge B that can be extracted from the battery 11.

ST120:

The temperature average value calculating unit 203 calculates an average value Ma of the temperature in averaging time TA (e.g., the last 24 hours) based on the temperature information (temperature measurement value) obtained in step ST100. Further, the voltage average value calculating unit 204 calculates an average value Vb of the voltage that is corrected according to the temperature based on: the voltage information (voltage measurement value) obtained in step ST100; and the average value Ma of the temperature calculated by the temperature average value calculating unit 203.

Figure 10:
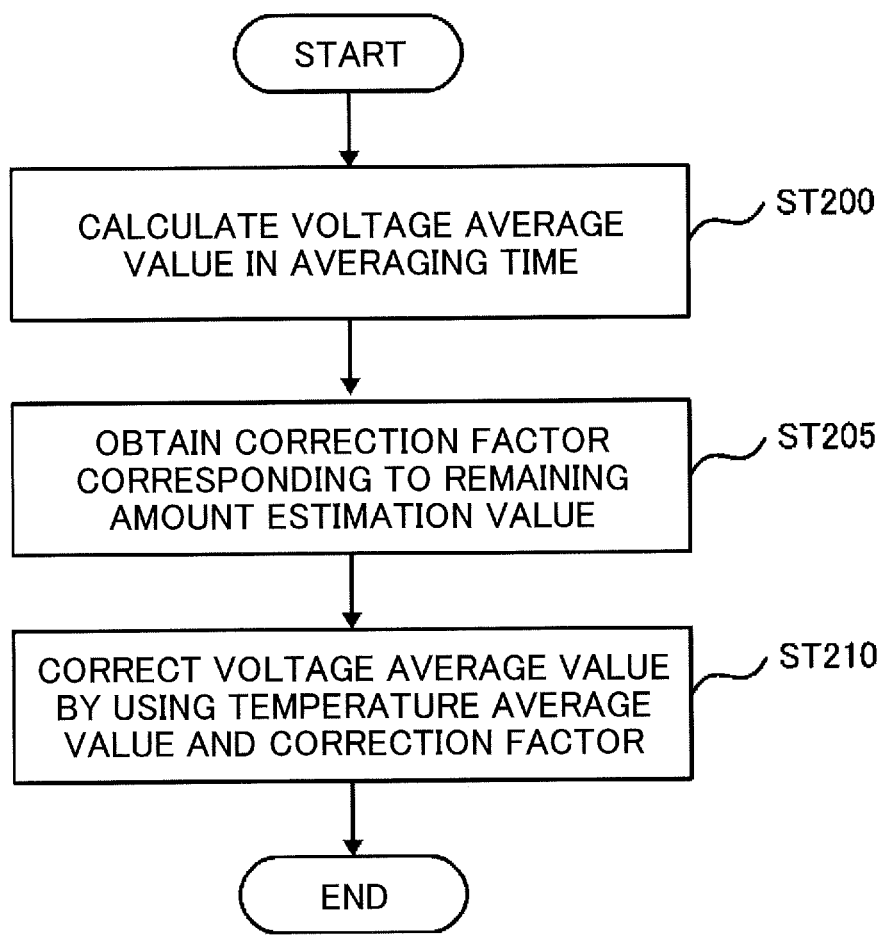
FIG. 10 is a flowchart illustrating a process of calculating an average value of the battery voltage.

FIG. 10 is a flowchart illustrating a process of calculating an average value Vb of the voltage by the voltage average value calculating unit 204. The voltage average value calculating unit 204 calculates an average value Va of the voltage of the battery 11 during averaging time TA based on the voltage information (voltage measurement value) obtained in step ST100 (ST200). Further, the voltage average value calculating unit 204 reads, from the data table (FIG. 6) stored in the memory unit 25 in advance, a correction factor α corresponding to the remaining amount of the battery 11 estimated by the remaining battery amount estimation unit 206 (ST205). The voltage average value calculating unit 204 calculates an average voltage value Vb by correcting the average value Va of the voltage calculated in step ST200 according to formula (5) by using the average value Ma of the temperature and the correction factor α (step ST210).

ST125:

The second estimation unit 208 estimates the remaining amount of the battery 11 based on: an average value Vb of the voltage calculated by the voltage average value calculating unit 204; and an average value Ma of the temperature calculated by the temperature average value calculating unit 203 by referring to the data table (FIG. 8) in the memory unit 25.

ST130:

The voltage reference value calculating unit 205 calculates a reference value Vs of the voltage of the battery 11 before the rapid decrease of the voltage based on the average value Vb of the voltage calculated in step ST120.

Figure 11:
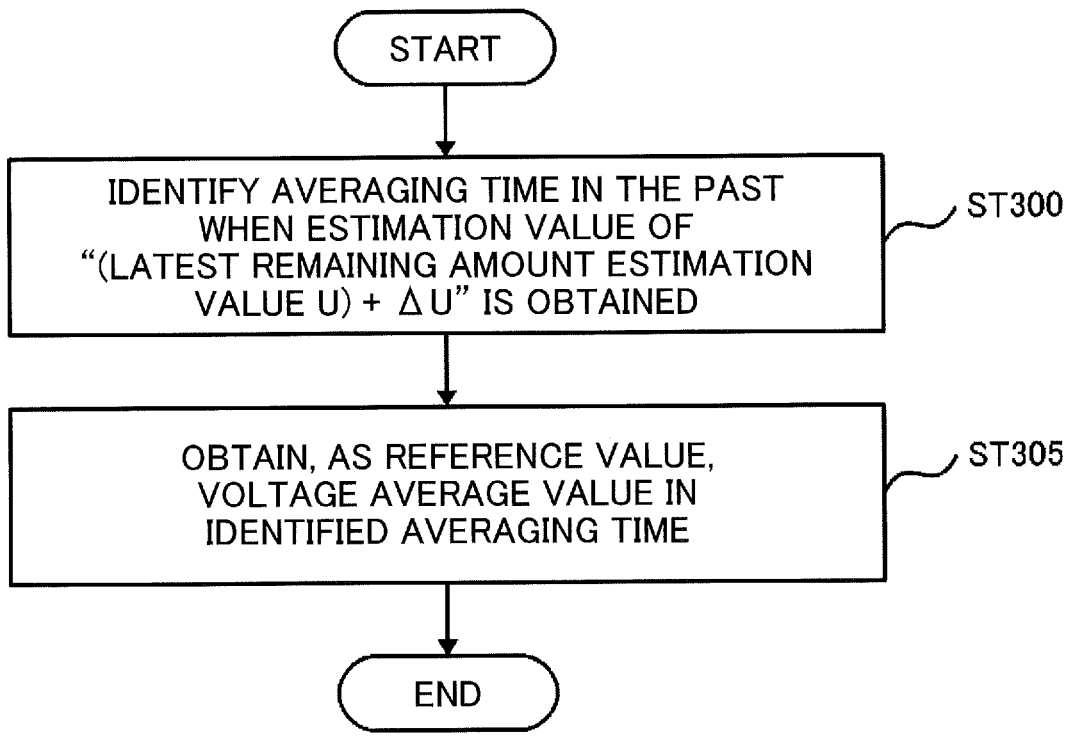
FIG. 11 is a flowchart illustrating a process of calculating a reference value of the battery voltage.

FIG. 11 is a flowchart illustrating a process of calculating the reference value Vs of the voltage of the battery 11. The voltage reference value calculating unit 205 identifies an averaging time TA in the past in which an estimated value U+ΔU, which is different from the estimated value U of the latest remaining battery amount by a predetermined value ΔU, has been obtained by the first estimation unit 207 (ST300). For example, the voltage reference value calculating unit 205 searches for an estimated result that is closest to the estimated value U+ΔU from among the estimated results in the past stored in the memory unit 25 by the estimation unit 207, and identifies the process cycle (one of the cycles of the process illustrated in FIG. 9) in which the searched estimated result has been obtained. The start time and the end time of one of the averaging time periods TA are different from the start time and the end time of another of the averaging time periods. Therefore, identifying the process cycle is equivalent to identifying the averaging time period TA. The voltage reference value calculating unit 205 obtains, as the reference value Vs of the voltage, the average value Vb that is calculated by the voltage average value calculating unit 204 in the averaging time period TA corresponding to the identified process cycle (ST305).

ST135:

The first determination unit 209 compares a voltage difference (Vs−Vb) between the average voltage value Vb calculated in step ST120 and the reference voltage value Vs calculated in step ST130 with a first threshold value Th1, determines that the first estimation method (step ST115) is appropriate in the case where the voltage difference (Vs−Vb) is less than the first threshold value Th1, and determines that the second estimation method (step S125) is appropriate in the case where the voltage difference (Vs−Vb) is greater than the first threshold Th1.

ST140:

The operating time estimation unit 212 estimates time during which the electronic device 1 is operable based on: the estimated value of the remaining amount of the battery 11 according to the estimation method that is determined to be appropriate in step ST135 (the estimated value in step ST115 or the estimated value in step ST125); and the estimated value of the discharged current of the battery 11. For example, the operating time estimation unit 212 calculates an estimated average current, "D/TR", that is obtained by dividing the latest discharged electric charge amount D, which is calculated in step ST105, by the predetermined time period TR, and calculates an estimated value of the time during which the electronic device 1 is operable by dividing the remaining electric charge amount, which corresponds to the remaining amount of the battery 11 estimated by the remaining battery amount estimation unit 206, by the estimated average current.

As described above, according to an embodiment of the present invention, a circuit for current measurement is not necessary because: the discharged electric charge amount D per predetermined time TR is calculated based on the operating state information; the total amount S of the discharged electric charge is calculated based on the discharged electric charge amount D; and the remaining amount of the battery 11 is estimated based on the total amount S of discharged electric charge. Therefore, when compared with the conventional device that requires a current measurement circuit, the size of the device can be made smaller, the power consumption can be reduced, and operating time can be made longer.

According to an embodiment of the present invention, the remaining amount of the battery 11 is estimated based on: the first estimation method that is based on the total amount S of the discharged electric charge; and the second estimation method that is based on the average value Vb of the voltage and the average value Ma of the temperature. It is determined that it is appropriate to use the first estimation method in the case where the voltage difference (Vs−Vb) between the reference value Vs of the voltage before the rapid decrease of the voltage of the battery 11 and the average value Vb of the voltage is less than the first threshold value Th1, and it is determined that it is appropriate to use the second estimation method in the case where the voltage difference (Vs−Vb) exceeds the first threshold value Th1. According to the above, it is determined that it is appropriate to use the first estimation method in a state before the rapid decrease of the voltage of the battery 11, and it is determined that it is appropriate to use the second estimation method in a state in which the voltage of the battery 11 rapidly decreases. Therefore, it becomes possible to select appropriately, as the estimation result of the remaining amount of the battery 11, an estimation result based on the first estimation method or an estimation result based on the second estimation method. Further, the reference voltage value Vs is calculated based on the average voltage value Vb. Therefore, even in the case where there is a battery characteristics variation due to individual difference, an appropriate reverence value Vs corresponding to the variation can be obtained, and it is possible to determine the estimation method accurately.

According to an embodiment of the present invention, by making reference to a state of the battery 11 in which an estimated value U+ΔU, which is different from the latest estimated value U of the remaining battery amount by a predetermined value ΔU, is obtained by the first estimation unit 207, an average value Vb of the voltage that is calculated in the state is obtained as a reference value Vs of the voltage. According to the above, even in the case where there is a battery characteristics variation due to individual difference, an appropriate reference value corresponding to the variation can be obtained.

According to an embodiment of the present invention, the average voltage value Va in the averaging time TA is corrected according to the average temperature value Ma in the averaging time TA (formula (5)). Therefore, it is possible to obtain an appropriate average voltage value Vb in which temperature influence of the battery 11 is included. Further, a correction factor α of the correction value Vc for the difference (Ms−Ma) between the temperature average value Ma and the reference temperature value Ms is changed according to the remaining amount of the battery 11 estimated by the remaining battery amount estimation unit 206 (FIG. 6), and thus, it is possible to obtain an average value Vb of the voltage in which the influence of the remaining amount of the battery 11 is included. Therefore, it is possible to accurately determine the estimation method, and it is possible to accurately estimate the remaining amount of the battery 11 in the second estimation method.

It should be noted that an embodiment of the present invention is not limited to what has been described above, and various variations described below are included, for example.

Modified Example 1

In an embodiment described above, the voltage reference value calculating unit 205 obtains, as the reference value Vs of the voltage, an average value Vb of the voltage corresponding to the estimated value U+ΔU that is determined relatively from the estimated value U of the latest remaining amount.

With respect to the above, in a modified example, the voltage reference value calculating unit 205 identifies a plurality of averaging times TA corresponding to a plurality of points in time at which estimated values are obtained by the first estimation unit 207, the estimated values corresponding to a plurality of predetermined remaining battery amounts, and obtains, as the reference value Vs of the voltage, an average value calculated by further averaging a plurality of average values calculated by the voltage average value calculation unit 204 for the identified averaging times TA.

Figure 12:
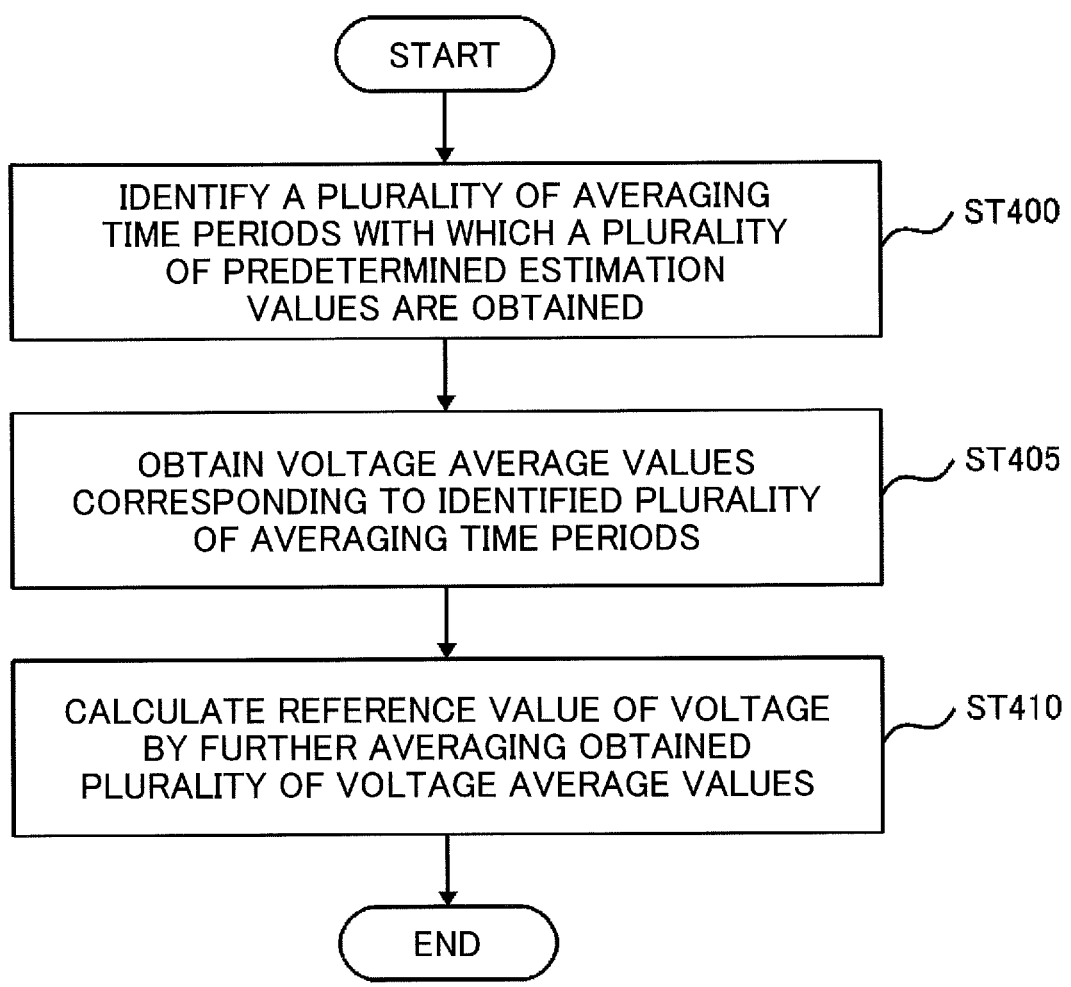
FIG. 12 is a flowchart illustrating a modified example of a process of calculating a reference value of the battery voltage.

FIG. 12 is a flowchart illustrating a modified example of a process of calculating the reference value Vs of the voltage of the battery 11. The voltage reference value calculating unit 205 identifies a plurality of averaging times TA in the past in which a plurality of predetermined estimated values (e.g., 95%, 90%, 85%, 80%, 75%, 70%) have been obtained (ST400). For example, the voltage reference value calculating unit 205 searches for estimated results that are closest to predetermined estimated values (95%, 90%, . . . , 70%) from among the estimated results in the past stored in the memory unit 25 by the estimation unit 207, and identifies the process cycles (ones of the cycles of the process illustrated in FIG. 9) in which the searched estimated results have been obtained. The voltage reference value calculating unit 205 calculates the reference value Vs of the voltage by reading, from the memory unit 25, a plurality of average values Vb calculated by the voltage average value calculating unit 204 in a plurality of averaging times TA corresponding to the identified plurality of process cycles (ST405), and by further calculating an average of the read plurality of average values Vb (ST410).

According to the above-described modified example, by calculating the reference value Vs of the voltage by calculating an average of a plurality of average values Vb of the voltage corresponding to a plurality of predetermined estimated values, even in the case where the voltage decreases relatively slowly in response to decreasing of the remaining amount, the voltage difference (Vs−Vb) between the reference value Vs of the voltage and the average value Vb of the voltage still increases steadily. Therefore, it is possible for the first determination unit 209 to determine the estimation method accurately.

Modified Example 2

Figure 13:
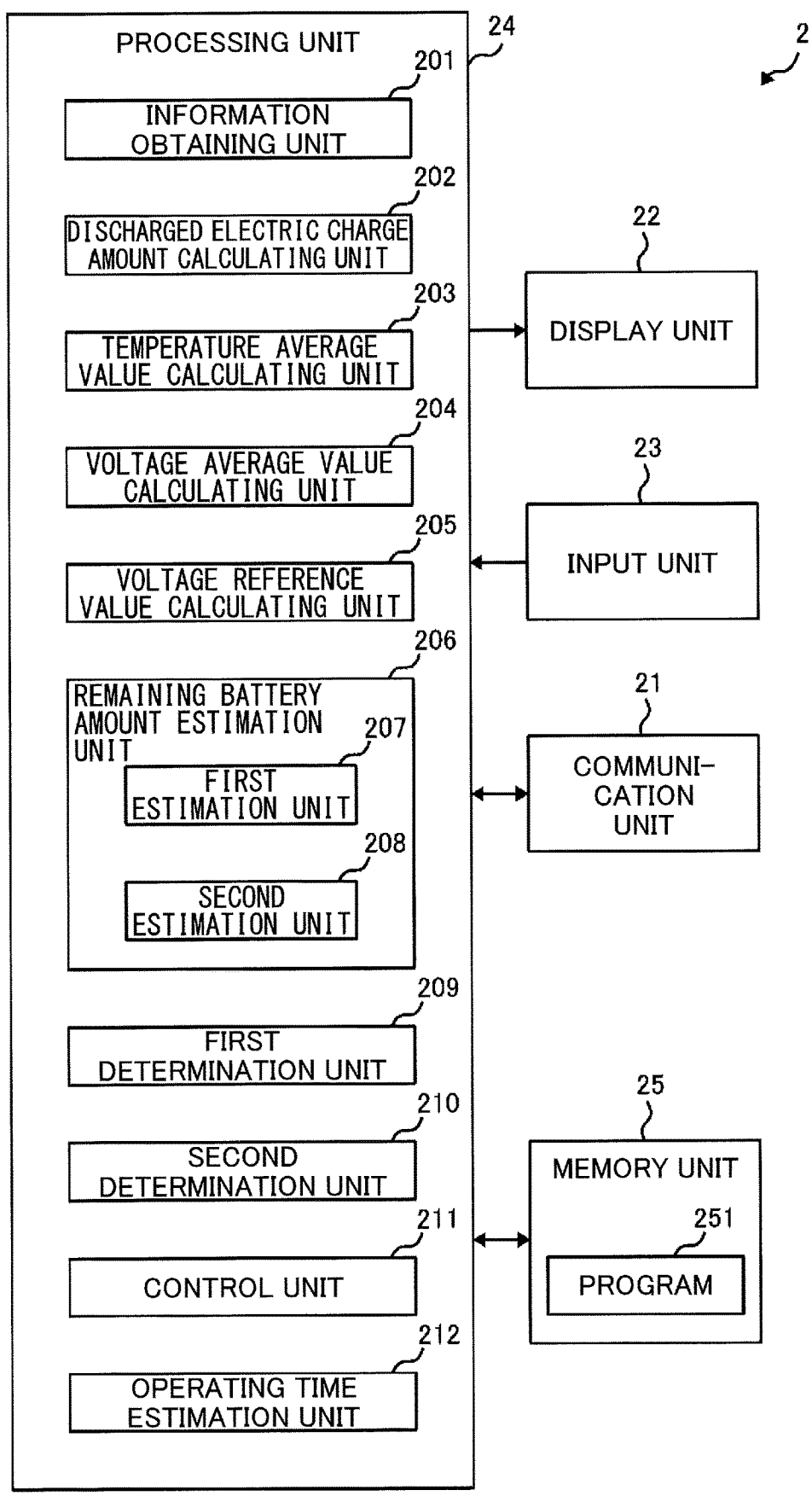
FIG. 13 is a drawing illustrating a structure of a modified example of the remaining battery estimation device.

FIG. 13 is a drawing illustrating a structure of a modified example of the remaining battery estimation device 2. In the remaining battery amount estimation device 2 according to the modified example, a second determination unit 210 and a control unit 211 are added to the process unit 24 of the remaining battery amount estimation device 2 illustrated in FIG. 3.

The second determination unit 210 compares a voltage difference (Vs−Vb) between the average voltage value Vb calculated by the voltage average value calculating unit 204 and the reference value Vs of the voltage calculated by the voltage reference value calculating unit 205 with a second threshold value Th2 that is less than the first threshold value Th1.

The control unit 211 is a block having a function for controlling the electronic device 1. In the case where the second determination unit 210 determines that the voltage difference (Vs−Vb) is greater than the second threshold value Th2, the control unit 211 transmits a control signal from the communication unit 21 to the electronic device 1 so as to increase frequency of measurement of the voltage and the temperature of the battery 11.

Further, in the modified example, in the case where the second determination unit 210 determines that the voltage difference (Vs−Vb) is greater than the second threshold value Th2, the information obtaining unit 201, the temperature average value calculating unit 203, the voltage average value calculating unit 204, the voltage reference value calculating unit 205, and the first determination unit 209 increase execution frequencies of respective operations. In other words, the information obtaining unit 201 increases frequency of obtaining voltage information and temperature information, the temperature average value calculating unit 203 increases frequency of calculating the average temperature value Ma, the voltage average value calculating unit 204 increases frequency of calculating the average voltage value Vb, the voltage reference value calculating unit 205 increases frequency of reference voltage value Vs, and the first determination unit 209 increases frequency of determining the estimation method.

According to the modified example, in the case where the voltage difference (Vs−Vb) between the average value Vb of the voltage and the reference value Vs of the voltage has become close to a state of exceeding the first threshold value Th1, frequency of determination, by the first estimation unit 207, is increased. Therefore, accuracy of the determination is increased and it becomes possible to select appropriately an estimation result of the remaining battery amount. With respect to the above, in a state in which the voltage difference (Vs−Vb) is away from the first threshold value Th1, it is possible to decrease frequency of determining the estimation method by the first estimation unit 207, and it is possible to decrease frequency of executing operations of other function blocks. Therefore, it is possible to reduce the power consumption of the electronic device 1 or the remaining battery amount estimation device 2.

Modified Example 3

Figure 14:
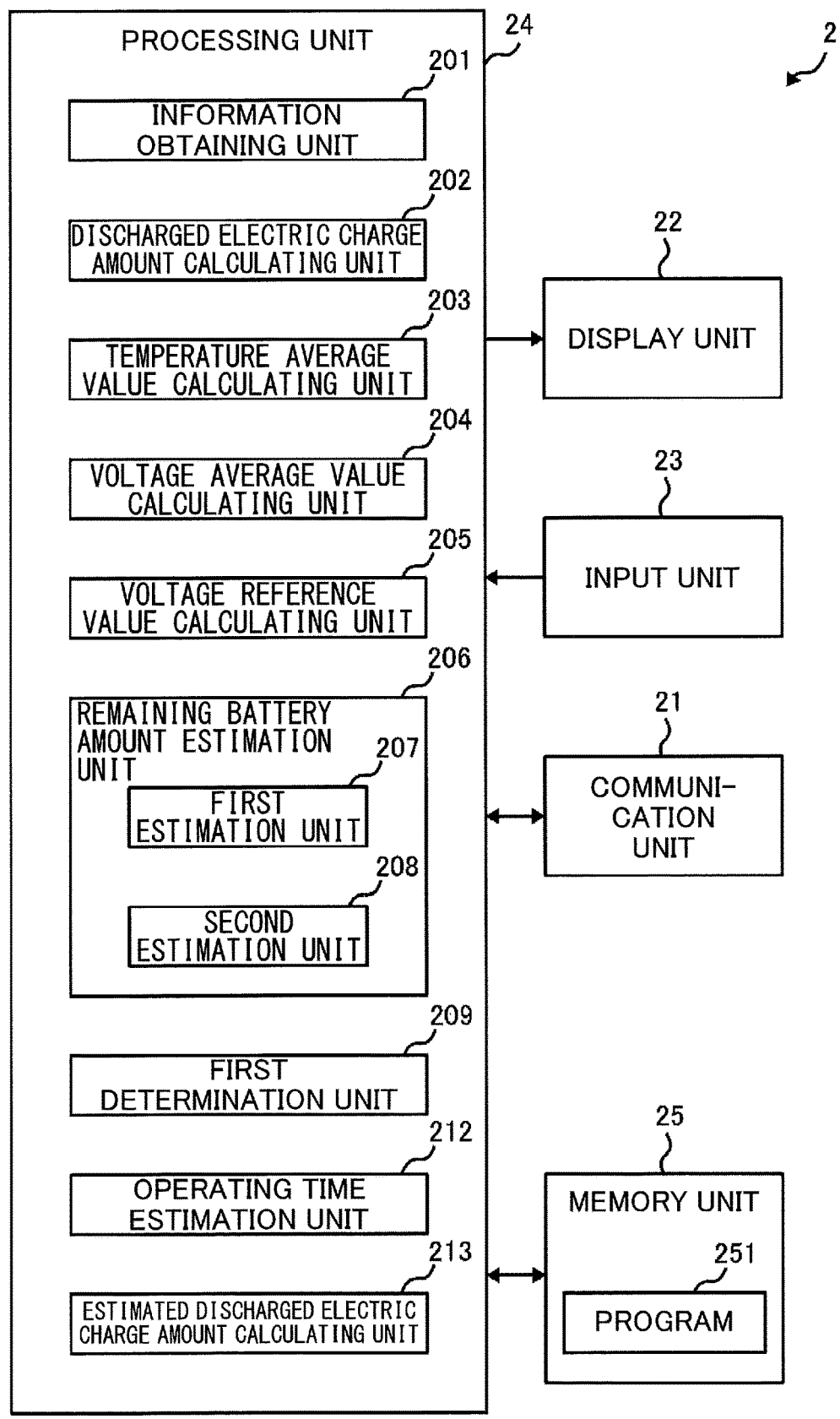
FIG. 14 is a drawing illustrating a structure of another modified example of the remaining battery estimation device.

FIG. 14 is a drawing illustrating a structure of a modified example of the remaining battery estimation device 2. In the remaining battery amount estimation device 2 according to the modified example, an estimated discharged electric charge amount calculating unit 213 is added to the process unit 24 of the remaining battery amount estimation device 2 illustrated in FIG. 3.

The estimated discharged electric charge amount calculating unit 213 calculates an estimated discharged electric charge amount of the battery 11 per the predetermined time based on estimated operating state information related to an estimated operating state of the electronic device 1 per the predetermined time. The estimated operating state information is similar to the operating state information (FIG. 4A) that has already been described. A calculation method of the estimated discharged electric charge amount is the same as the calculation method of the discharged electric charge amount D by the discharged electric charge amount calculating unit 202. With respect to the fact that the discharged electric charge amount calculating unit 202 calculates an actual discharged electric charge amount, the estimated discharged electric charge amount calculating unit 213 calculates a discharged electric charge amount to be discharged after the current point in time.

An operating time estimation unit 212 according to the modified example estimates time in which the electronic device 1 is operable based on: the remaining amount of the battery 11 estimated by the remaining battery amount estimation unit 206; and an estimated discharged electric charge amount per the predetermined time calculated by the estimated discharged electric charge amount calculating unit 21. For example, the operating time estimation unit 212 repeats accumulation of estimated discharged electric charge amount per the predetermined time until reaching the remaining electric charge amount corresponding to the estimated value of the remaining amount of the battery 11, and obtains, as the estimated result of the operating time, discharge time of the battery 11 corresponding to the repeated number of the accumulations.

According to the above-described modified example, it is possible to estimate more accurate operating time based on the estimated discharged electric charge amount per the predetermined time.

Modified Example 4

FIG. 15A is a drawing illustrating a modified example of the first electric charge amount information. In this modified example, the first electric charge amount information includes information related to temperature characteristics of the first electric charge amount QX. The first electric charge amount information illustrated in FIG. 15A includes, as the information related to the temperature characteristics, the first electric charge amounts QX corresponding to a plurality of predetermined temperatures. The discharged electric charge amount calculating unit 202 changes the first electric charge amount QX used for calculating the first discharged electric charge amount DX based on: the information related to temperature characteristics of the first electric charge amount QX; and the temperature of the battery 11 indicated by the temperature information.

For example, the discharged electric charge amount calculating unit 202 reads the first electric charge amount QX corresponding to the temperature average value MA from a data table (FIG. 15A), and uses the read first electric charge amount QX for calculating the first discharged electric charge amount DX.

According to this modified example, the first electric charge amount QX used for calculating the first discharged electric charge amount DX is changed based on: the temperature characteristics of the first electric charge amount QX; and the temperature of the battery 11 indicated by the temperature information. According to the above, the first discharged electric charge amount DX is calculated using the appropriate first electric charge amount QX corresponding to the temperature of the battery 11, and thus, accuracy of the first discharged electric charge amount DX is increased.

Modified Example 5

FIG. 15B is a drawing illustrating a modified example of the second electric charge amount information. In this modified example, the second electric charge amount information includes information related to temperature characteristics of the second electric charge amount QS. The second electric charge amount information illustrated in FIG. 15B includes, as the information related to the temperature characteristics, the second electric charge amounts QS corresponding to a plurality of predetermined temperatures. The discharged electric charge amount calculating unit 202 changes the second electric charge amount used for calculating the second discharged electric charge amount DS based on: the information related to temperature characteristics of the second electric charge amount QS; and the temperature of the battery 11 indicated by the temperature information. In other words, the discharged electric charge amount calculating unit 202 reads the second electric charge amount QS corresponding to the temperature average value Ma from a data table (FIG. 15B), and uses the read second electric charge amount QS for calculating the second discharged electric charge amount DS.

According to this modified example, the second electric charge amount QS used for calculating the second discharged electric charge amount DX is changed based on: the temperature characteristics of the second electric charge amount QS; and the temperature of the battery 11 indicated by the temperature information. According to the above, the second discharged electric charge amount DS is calculated using the appropriate second electric charge amount QS corresponding to the temperature of the battery 11, and thus, accuracy of the second discharged electric charge amount DS is increased.

DESCRIPTION OF THE REFERENCE NUMERALS 1 electronic device
11 battery 12 voltage measurement unit
13 temperature measurement unit
14 communication unit
15 sensor unit
16 processing unit
17 memory unit
2 remaining battery amount estimation device
21 communication unit
22 display unit
23 input unit
24 processing unit
25 memory unit
251 program
201 information obtaining unit
202 discharged electric charge amount calculating unit
203 temperature average value calculating unit
204 voltage average value calculating unit
205 voltage reference value calculating unit
206 remaining battery amount estimation unit
207 first estimation unit
208 second estimation unit
209 first determination unit
210 second determination unit
211 control unit
212 operating time estimation unit
213 estimated discharged electric charge amount calculating unit
9 network

What is claimed is:

1. A remaining battery amount estimation device for estimating a remaining amount of a battery for supplying power to an electronic device, the remaining battery amount estimation device comprising:
a discharged electric charge amount calculating unit configured to calculate a discharged electric charge amount of the battery per a predetermined time based on operating state information related to an operating state of the electronic device for each predetermined time;
a remaining amount estimation unit configured to calculate a total amount of an electric charge discharged from the battery based on a discharged electric charge amount per the predetermined time, and estimate a remaining amount of the battery based on the total amount of the discharged electric charge,
an information obtaining unit configured to obtain voltage information related to a voltage of the battery and temperature information related to a temperature of the battery;
a temperature average value calculating unit configured to calculate an average value of the temperature of the battery based on the temperature information;
a voltage average value calculating unit configured to calculate an average value of the voltage of the battery based on the voltage information;
a voltage reference value calculating unit configured to calculate a reference value of the voltage before rapid decreasing of the battery voltage based on the average value of the voltage; and
a first determination unit configured to
compare a voltage difference between the average value of the voltage and the reference value of the voltage with a first threshold value,
determine that a first estimation method, in which the remaining amount of the battery is estimated based on the total amount of the discharged electric charge, is appropriate in a case where the voltage difference is less than the first threshold value, and
determine that a second estimation method, in which the remaining amount of the battery is estimated based on the average value of the voltage and the average value of the temperature, is appropriate in a case where the voltage difference exceeds the first threshold value, wherein
the remaining amount estimation unit includes
a first estimation unit that estimates the remaining amount of the battery based on the first estimation method, and
a second estimation unit that estimates the remaining amount of the battery based on the second estimation method.

2. The remaining battery amount estimation device according to claim 1, wherein
the operating state information includes information related to the number of times an operation of the electronic device has been executed in the predetermined time with respect to each of operation types, and
the discharged electric charge amount calculating unit calculates a first discharged electric charge amount in an operation period of the electronic device within the predetermined time based on
first electric charge information including information related to a first electric charge amount that is discharged from the battery with an execution of the operation with respect to each of operation types, and
the operating state information.

3. The remaining battery amount estimation device according to claim 2, further comprising:
an information obtaining unit configured to obtain temperature information related to a temperature of the battery, wherein
the first electric charge amount information includes information related to temperature characteristics of the first electric charge amount, and
the discharged electric charge amount calculating unit changes the first electric charge amount used for calculating the first discharged electric charge amount based on
the information related to temperature characteristics of the first electric charge amount, and
the temperature of the battery indicated by the temperature information.

4. The remaining battery amount estimation device according to claim 2, wherein
the discharged electric charge amount calculating unit calculates a second discharged electric charge amount in a waiting period of the electronic device within the predetermined time based on
time information including information related to execution time per execution of the operation for each of the operation types,
the operating state information, and
the second electric charge amount information related to the second electric charge amount that is discharged from the battery per unit time when the electronic device is in a waiting state.

5. The remaining battery amount estimation device according to claim 4, further comprising:
an information obtaining unit configured to obtain temperature information related to a temperature of the battery, wherein
the second electric charge amount information includes information related to temperature characteristics of the second electric charge amount, and the discharged electric charge amount calculating unit changes the second electric charge amount used for calculating the second discharged electric charge amount based on
  the information related to temperature characteristics of the second electric charge amount, and
  the temperature of the battery indicated by the temperature information.

6. The remaining battery amount estimation device according to claim 1, wherein
the voltage average value calculating unit calculates the average value based on the voltage information that is obtained after the total amount of the discharged electric charge calculated by the first estimation unit has exceeded a predetermined minimum value.

7. The remaining battery amount estimation device according to claim 1, further comprising:
a control unit configured to control the electronic device; and
a second determination unit configured to determine whether the voltage difference between the average value of the voltage and the reference value of the voltage has become greater than a second threshold value that is less than the first threshold value, wherein
in a case where it is determined by the second determination unit that the voltage difference is greater than the second threshold value,
  the control unit controls the electronic device to increase frequency of the battery voltage measurement,
  the information obtaining unit increases frequency of obtaining, by the electronic device, a voltage measurement value as the voltage information,
  the voltage average value calculating unit increases frequency of calculating the average value of the voltage,
  the voltage reference value calculating unit increases frequency of calculating the reference value of the voltage, and
  the first determination unit increases frequency of determining the estimation method.

8. The remaining battery amount estimation device according to claim 1, wherein
the temperature average value calculating unit calculates an average value of the temperature in a predetermined averaging time, and
the voltage average value calculating unit corrects the average value of the voltage in the averaging time according to the average value of the temperature.

9. The remaining battery amount estimation device according to claim 8, wherein
the voltage average value calculating unit calculates a sum of
  a correction value corresponding to a difference between the average value of the temperature and a reference temperature, and
  the average value of the voltage.

10. The remaining battery amount estimation device according to claim 9, wherein
the voltage average value calculating unit changes a correction factor of the correction value corresponding to the difference between the average value of the temperature and the reference temperature based on the remaining battery amount estimated by the remaining amount estimation unit.

11. The remaining battery amount estimation device according to claim 8, wherein the voltage reference value calculating unit identifies the averaging time corresponding to a point in time at which an estimated value is obtained by the first estimation unit, the estimated value being different from the latest estimated value of the remaining battery amount by a predetermined value, and
obtains, as the reference value of the voltage, the average value calculated by the voltage average value calculating unit with respect to the identified averaging time.

12. The remaining battery amount estimation device according to claim 8, wherein
the voltage reference value calculating unit
  identifies a plurality of averaging times corresponding to a plurality of points in time at which estimated values are obtained by the first estimation unit, the estimated values coinciding a plurality of predetermined remaining battery amounts, and
  obtains, as the reference value of the voltage, an average value calculated by further averaging a plurality of average values calculated by the voltage average value calculation unit with respect to the identified averaging times.

13. The remaining battery amount estimation device according to claim 1, further comprising:
an operating time estimation unit configured to estimate time in which the electronic device is operable (capable of operation) based on
  an estimated value of discharge current of the battery, and
  the remaining battery amount estimated by the remaining amount estimation unit.

14. The remaining battery amount estimation device according to claim 1, further comprising:
an estimated discharged electric charge amount calculating unit configured to calculate an estimated discharged electric charge amount of the battery per the predetermined time based on estimated operating state information related to an estimated operating state of the electronic device for each predetermined time; and
an operating time estimation unit configured to estimate time in which the electronic device is operable (capable of operation) based on
  an estimated discharged electric charge amount per the predetermined time, and
  the remaining battery amount estimated by the remaining amount estimation unit.

15. A remaining battery amount estimation method for estimating a remaining amount of a battery for supplying power to an electronic device, the remaining battery amount estimation method comprising:
calculating a discharged electric charge amount of the battery per the predetermined time based on operating state information related to an operating state of the electronic device for each predetermined time; and
calculating a total amount of an electric charge discharged from the battery based on the discharged electric charge amount per the predetermined time,
obtaining voltage information related to a voltage of the battery and temperature information related to a temperature of the battery;
calculating an average value of the temperature of the battery based on the temperature information;
calculating an average value of the voltage of the battery based on the voltage information;

calculating a reference value of the voltage before rapid decreasing of the battery voltage based on the average value of the voltage;

comparing a voltage difference between the average value of the voltage and the reference value of the voltage with a first threshold value, determining that a first estimation method, in which the remaining amount of the battery is estimated based on the total amount of the discharged electric charge, is appropriate in a case where the voltage difference is less than the first threshold value, and determining that a second estimation method, in which the remaining amount of the battery is estimated based on the average value of the voltage and the average value of the temperature, is appropriate in a case where the voltage difference exceeds the first threshold value, wherein the calculating the total amount of the electric charge includes estimating the remaining amount of the battery based on the first estimation method, and estimating the remaining amount of the battery based on the second estimation method.

16. The remaining battery amount estimation method according to claim 15, further comprising:

obtaining voltage information related to a voltage of the battery;

obtaining temperature information related to a temperature of the battery;

calculating an average value of the temperature of the battery based on the temperature information;

calculating an average value of the voltage of the battery based on the voltage information;

calculating a reference value of the voltage before rapid decreasing of the battery voltage based on the average value of the voltage;

comparing a voltage difference between the average value of the voltage and the reference value of the voltage with a first threshold value;

determining that a first estimation method, in which the remaining amount of the battery is estimated based on the total amount of the discharged electric charge, is appropriate in a case where the voltage difference is less than the first threshold value; and determining that a second estimation method, in which the remaining amount of the battery is estimated based on the average value of the voltage and the average value of the temperature, is appropriate in a case where the voltage difference exceeds the first threshold value, wherein estimating the remaining battery amount includes estimating the remaining amount of the battery based on the first estimation method, and estimating the remaining amount of the battery based on the second estimation method.

17. A non-transitory computer-readable recording medium having a program for causing a computer to execute the remaining battery amount estimation method according to claim 15.

* * * * *